United States Patent
Raaijmakers et al.

[11] Patent Number: 6,068,441
[45] Date of Patent: May 30, 2000

[54] SUBSTRATE TRANSFER SYSTEM FOR SEMICONDUCTOR PROCESSING EQUIPMENT

[75] Inventors: Ivo Raaijmakers, Phoenix; Loren Jacobs, Mesa; Mike Halpin, Phoenix; Jim Alexander, Tempe; Ken O'Neill, Phoenix; Dennis Lee Goodwin, Chandler, all of Ariz.

[73] Assignee: ASM America, Inc., Phoenix, Ariz.

[21] Appl. No.: 08/976,537

[22] Filed: Nov. 21, 1997

[51] Int. Cl.$^7$ .......................... B65G 49/07; H01L 21/68
[52] U.S. Cl. .................. 414/609; 414/180; 414/785; 414/804; 414/941; 294/32; 294/902
[58] Field of Search ............................. 414/609, 180, 414/186, 785, 804, 805, 814, 935, 937, 941; 294/902, 1.1, 32

[56] References Cited

U.S. PATENT DOCUMENTS

| | | |
|---|---|---|
| 3,708,851 | 1/1973 | Vladik . |
| 4,281,031 | 7/1981 | Hillman et al. .......................... 438/759 |
| 4,433,951 | 2/1984 | Koch et al. ............... 414/217 |
| 4,775,281 | 10/1988 | Prentakis . |
| 4,951,601 | 8/1990 | Maydan et al. . |
| 5,022,695 | 6/1991 | Ayers ......................... 294/88 |
| 5,046,909 | 9/1991 | Murdoch . |
| 5,061,144 | 10/1991 | Akimoto et al. . |
| 5,096,291 | 3/1992 | Scott ....................... 356/244 |
| 5,104,694 | 4/1992 | Saito et al. ............... 427/255 |
| 5,445,491 | 8/1995 | Nakagawa et al. ..................... 414/805 |
| 5,518,542 | 5/1996 | Matsukawa et al. ..................... 118/52 |
| 5,643,366 | 7/1997 | Somekh et al. . |
| 5,692,873 | 12/1997 | Weeks et al. ............................. 414/627 |
| 5,700,046 | 12/1997 | Van Doren et al. ................. 294/119.1 |
| 5,746,460 | 5/1998 | Marohl et al. . |
| 5,765,889 | 6/1998 | Nam et al. ............................. 294/64.1 |
| 5,810,935 | 9/1998 | Lee et al. ................................ 118/728 |

FOREIGN PATENT DOCUMENTS

| | | |
|---|---|---|
| 0 272 141 A2 | 6/1988 | European Pat. Off. . |
| 0 853 333 A1 | 7/1998 | European Pat. Off. . |
| 61-140432 | 6/1986 | Japan . |
| 62-128539 | 6/1987 | Japan . |
| 5-47899 | 2/1993 | Japan . |
| 6-127621 | 5/1994 | Japan . |
| 7-22489 | 1/1995 | Japan . |
| 7-297262 | 11/1995 | Japan . |

*Primary Examiner*—Robert P. Olszewski
*Assistant Examiner*—Gerald O'Connor
*Attorney, Agent, or Firm*—Knobbe, Martens, Olson & Bear, LLP

[57] ABSTRACT

A system for facilitating wafer transfer comprises a susceptor unit consisting of an inner susceptor section which rests within an outer susceptor section. A vertically movable and rotatable support spider located beneath the susceptor unit can rotate into positions to engage either the inner or the outer susceptor sections. When the inner section is engaged, the support spider lifts the inner section vertically out of the outer section. When the outer section is engaged, the support spider raises and lowers the entire susceptor unit. A fork type robotic arm end effector permits wafer pick up and unloading by the inner susceptor section.

25 Claims, 8 Drawing Sheets

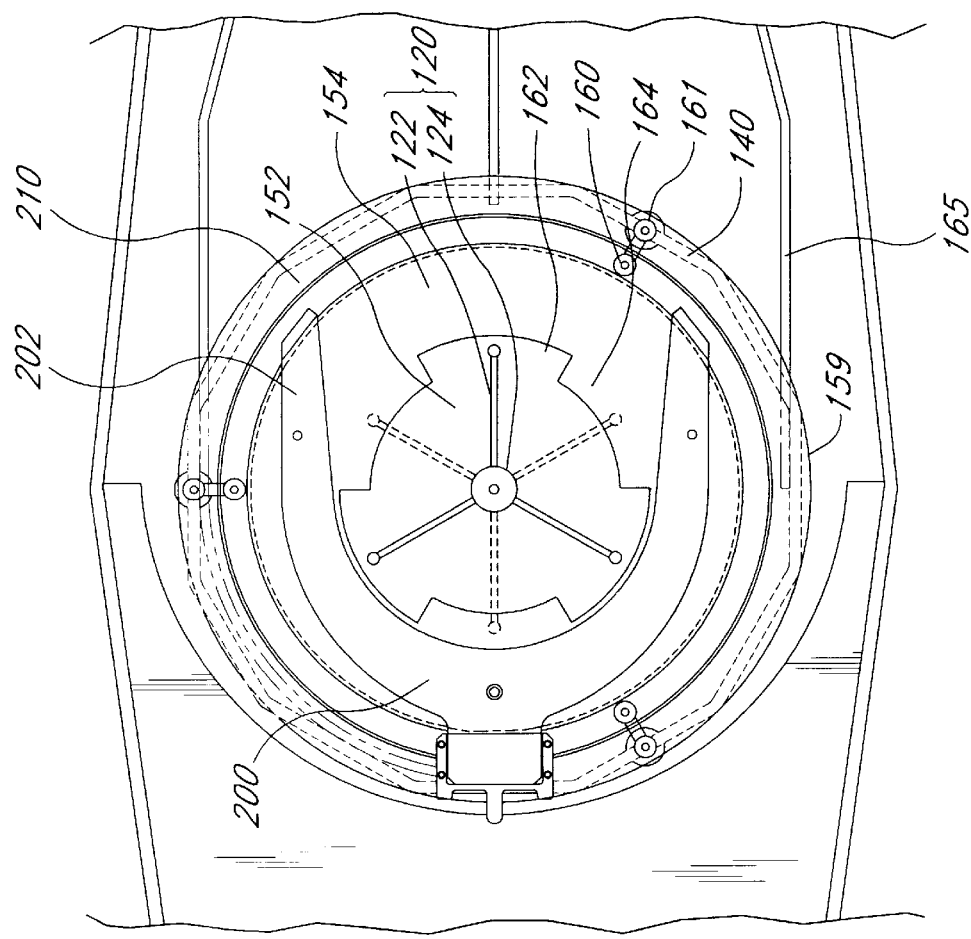

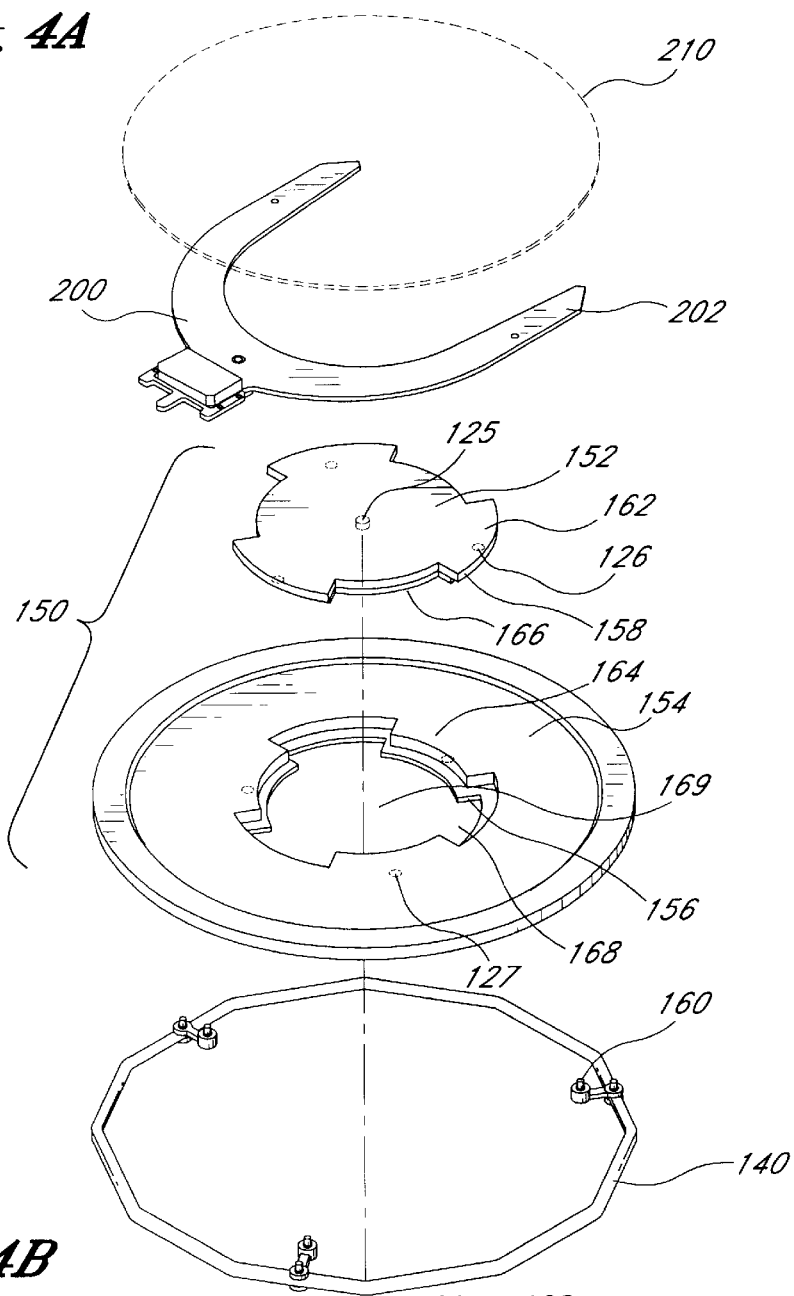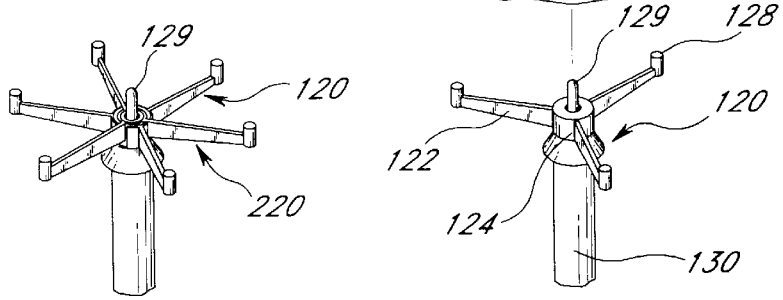

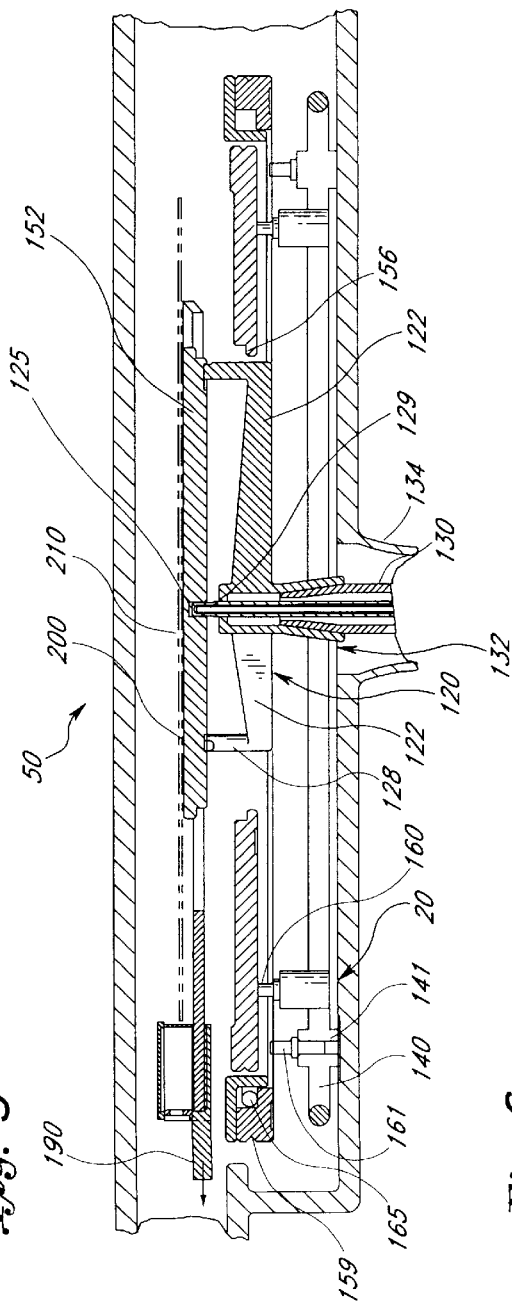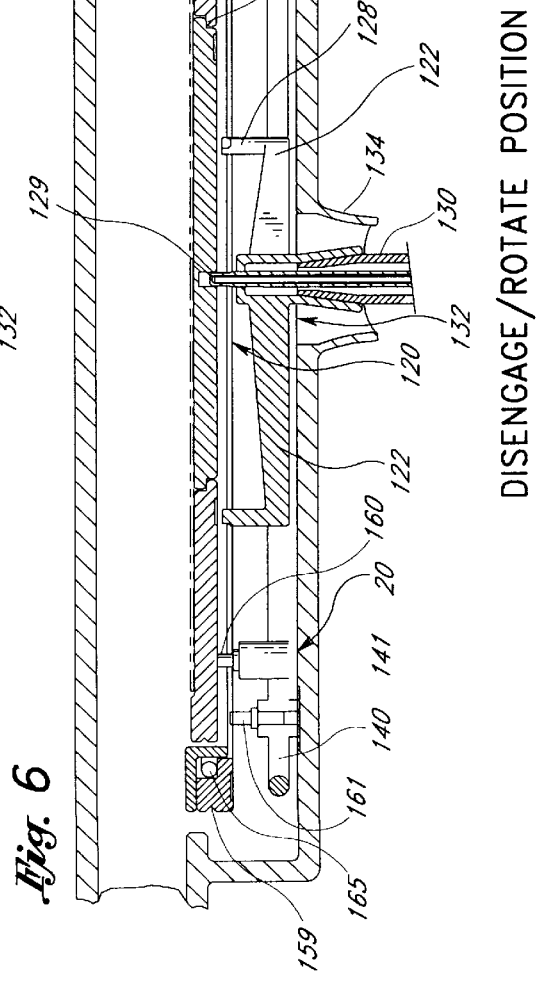

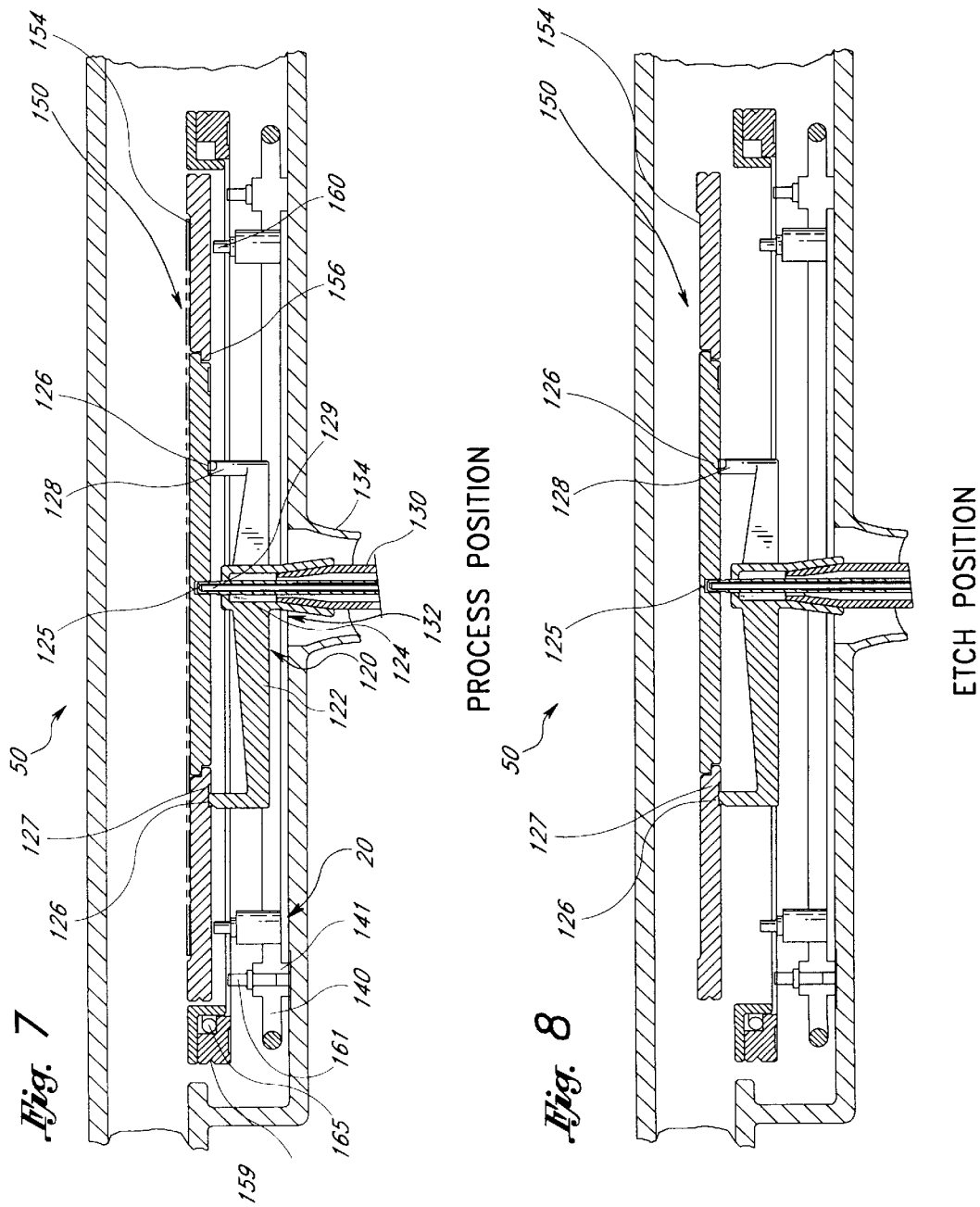

SUBSTRATE TRANSFER SYSTEM FOR SEMICONDUCTOR PROCESSING EQUIPMENT

BACKGROUND OF THE INVENTION

This invention relates to thermal reactors used in semiconductor wafer processing operations and, more particularly to a system for loading and unloading a wafer.

Semiconductor substrate, or wafers, are typically processed by chemical vapor deposition. Components included in semiconductor processing operations include a reaction chamber which is heated to a desired temperature and is configured to facilitate the controlled flow of a reactant gas, which contains the material to be deposited by thermal reaction onto a wafer. A base, which is commonly referred to in the art as a "susceptor," is usually provided in the reaction chamber for supporting the wafer during chemical vapor deposition. To facilitate automated processing, a robotic arm has been employed to place a wafer on a susceptor and subsequently, after processing, to remove it from the reactor.

Susceptors have evolved considerably during the last ten years, from simple flat platforms, which contributed nothing beyond their physical support to the processing operation, to susceptors provided with mechanisms for rotating the wafer during processing and sophisticated systems for sensing and responding to local temperature differences at the susceptor surface. Further, means for displacing the wafer from the susceptor after processing have been provided to assist in removal of the wafer by the robotic arm. Such innovations in susceptor design have contributed significantly to improved semiconductor quality and uniformity.

The means for facilitating wafer displacement from the susceptor surface and transfer to the robotic arm for removal from the reactor, remains problematic in automated semiconductor processing systems. One approach to wafer transfer operations, known in the art, involves using wafer support pins, which move vertically through holes in the susceptor to effect displacement of the wafer from the susceptor surface after processing.

The use of wafer support pins has several important shortcomings. Abrasion of the pins within the holes in the susceptor is caused both by the rotation of the susceptor as well as the different rates of thermal expansion exhibited by the stainless steel or quartz pins and the graphite susceptor. The abrasion results in particles which can contaminate the processing environment and compromise the quality of the processed semiconductor wafer. In addition to abrasion within the holes, marring of the backside of wafers has also been observed due to shrinkage of the hot wafers while supported on the relatively sharp pins. The longer cool down periods required to prevent such wafer damage tends to reduce reactor throughput.

A further problem associated with the use of wafer support pins is the permeation of processing gases through spaces that necessarily exist between the pins and the holes in the susceptor. As a result, the processing gases may deposit on the backsides of the wafers. Moreover, the presence of holes in the susceptor results in temperature non-uniformity both in the susceptor and in the wafer being supported thereon.

One approach taken to improve the pin-based wafer transfer operation is disclosed by U.S. Pat. No. 5,421,893 to Perlov. In that invention, the wafer displacement mechanism employs wafer support pins which are suspended from the susceptor. The use of freely suspended pins, as opposed to earlier pins, which were connected with both the vertical and rotational drive mechanisms, is intended to reduce pin abrasion within the holes in the susceptor during rotation. Further, the Perlov support pins have enlarged frusto-conical heads which fit into complementary depressions countersunk in the upper surface of the susceptor, providing a flat support surface and a sealing means for decreasing the permeation of processing gases to wafer backsides.

Notwithstanding the improvements related to diminished rotational abrasion and backside deposition, Perlov still employs a susceptor with a plurality of holes, which are likely, in view of the prior art, to cause temperature non-uniformities. In addition, contaminating particles are still likely to be generated by abrasion when the support pins slide vertically within the susceptor holes. Finally, shrinking of the hot wafer on support pins may still result in backside scratching. Thus, Perlov fails to resolve several of the most important problems inherent in the use of support pins as a means of separating the processed wafer from the susceptor.

Another approach to wafer transport is disclosed in U.S. Pat. No. 5,080,549 to Goodwin, et al. That invention relates to a wafer handling system which utilizes the Bernoulli Principle to effect contactless pick up of the wafer. Specifically, a robotic arm is adapted to include a plurality of gas outlets in the bottom plate of a pick up wand. The gas outlets radiate outward from a central portion of the wand in such a pattern as to produce an outward flow of gas across the top surface of the wafer. The gas flow creates an area of relatively low pressure between the top surface of the wafer and the bottom surface of the pick up wand, resulting in wafer pick up without physical contact. Unfortunately, while the Bernoulli wand addresses all of the major shortcomings associated with pin-based wafer transfer mechanisms and has some other advantages, it presents a different problem. In order to provide adequate gas flow, the robot arm and pick up wand assembly is too thick to fit between the unprocessed wafers in a standard wafer supply cassette and can stir up particles.

Therefore, the need exists for a mechanism which facilitates wafer loading from standard cassettes as well as unloading from a susceptor without using wafer support pins, thereby reducing particle contamination within the reactor, temperature non-uniformities, and backside damage during hot pick up.

SUMMARY OF THE INVENTION

A system for facilitating wafer transfer disclosed by the present invention includes a susceptor unit formed by separate sections. The sections are vertically and rotatably coupled to move as a single unit in a wafer processing or susceptor etch position. A rotatable support, such as multi-arm spider, rotates and supports one of the sections, which, in turn, rotates and supports the other section. The susceptor sections are also vertically movable relative to each other to cooperate with a wafer handling tool in a wafer load/unload position. The system further includes a second support for the susceptor sections, the two supports being vertically and rotatably movable relative to each other.

In one form of the susceptor unit, the inner and outer sections include a plurality of radially-oriented tabs and recesses which interlock to form the single susceptor unit. Further, the inner and outer sections are fashioned with offsetting marginal flanges to provide vertical support for the inner section within the outer section, thereby creating a substantially flat upper surface for receiving a wafer. In one form of the susceptor unit, the interlocking structure is beneath this upper surface and the interface between the two sections on the upper surface is circular.

In one form of the invention, the multi-arm spider located beneath the susceptor unit can rotate into positions to engage recesses of either the inner or the outer susceptor sections. When the inner section is engaged, the support spider can lift the inner section vertically out of the outer section. When the outer section is engaged, the spider can raise or lower the entire susceptor unit, as well as rotate it.

To facilitate wafer loading and unloading, a wafer is moved horizontally into a position in the reaction chamber directly over the susceptor by a robotic arm. The wafer is supported by a fork-type end effector on the robot arm. The spider, engaging only the inner susceptor section, raises the inner section, meeting the wafer cradled within the end effector and lifting it out of the end effector. Alternatively, the end effector could be lowered to place the wafer on the susceptor section. The robotic arm can then be withdrawn and the inner susceptor, together with the wafer, lowered into the outer susceptor, which is supported by the outer susceptor support. The support spider continues traveling downward leaving the wafer resting on the complete susceptor unit. Alternatively, the outer support could be raised to separate the susceptor from the spider. After disengaging from the inner section, the spider rotates to a second position which will engage the outer susceptor. The appropriate relative vertical movement of the supports, such as elevating the spider, can elevate the susceptor unit and the wafer up to the processing position.

After processing the wafer, the susceptor unit may be lowered onto the outer susceptor supports, allowing the spider to be rotated to engage the inner susceptor section again, and the inner section together with the processed wafer are raised. To effect removal of the processed wafer, the robotic arm once again moves horizontally into the reaction chamber. When the end effector is in position between the inner and outer susceptor sections, relative movement between the innersection and the end effector is provided such as by lowering the innersection through the open end effector, which receives the wafer and then withdraws from the chamber.

After removal of the wafer, the spider may be once more manipulated to lower the innersection into the outer section, moved further lower, and rotated to a position beneath the outer section. The entire unit can then be raised above the process position for an etching treatment. This allows etching of the back side of the susceptor, as well as the top side.

By substituting a separate, vertically movable inner susceptor section for the several support pins used to displace the wafer from the susceptor unit in prior wafer transfer systems, the present invention addresses each of the major problems identified in the earlier approaches. First, the movement of the inner susceptor section within the outer section produces minimal abrasion because the vertical distance traveled during which the two sections are in physical contact is only equal to the thickness of the susceptor sections. In contrast, support pins are moving in contact with the susceptor body for the entire vertical rise necessary for providing access to the robotic arm. Moreover, there is no significant abrasion in the present invention due to differences in thermal expansion rates between the inner and outer susceptor sections, because both susceptor sections are constructed out of the same material. Second, backside deposits and temperature non-uniformity are minimized by the overlapping flanges, which provide, in addition to vertical support for the inner section, an effective seal against permeation of reactant gases and more uniform heat transfer. Finally, because the wafer rests on the inner susceptor surface throughout transport and processing, there is little possibility for marring during hot pick up. Thus, the present invention facilitates automated loading and unloading of semiconductor substrates, while avoiding shortcomings inherent in support pin-mediated transfer mechanisms.

BRIEF DESCRIPTION OF THE DRAWINGS

FIG. 3 is a top view from 3-3 in FIG. 2, showing the wafer transfer and support mechanisms within the reaction chamber.

FIG. 4A is an exploded perspective view showing the arrangement of the support spider, the fixed support ring, the susceptor sections, the robotic arm end effector, and the wafer.

FIG. 4B is a perspective view of an alternate vertical lift arrangement.

FIG. 5 is a cross-sectional view of the reaction chamber showing the wafer transfer mechanism, wherein the inner susceptor section is shown lifting the wafer off the robotic arm end effector.

FIG. 6 is a cross-sectional view of the reaction chamber showing the wafer transfer mechanism, wherein the inner section has been lowered into the outer section to form a complete susceptor unit upon which the wafer is supported.

FIG. 7 is a cross-sectional view of the reaction chamber showing the wafer transfer mechanism, wherein the susceptor unit has been raised into position for wafer processing.

FIG. 8 is a cross-sectional view, showing the susceptor unit raised into an upper position for cleaning.

DETAILED DESCRIPTION OF THE PREFERRED EMBODIMENT

Figure 1:
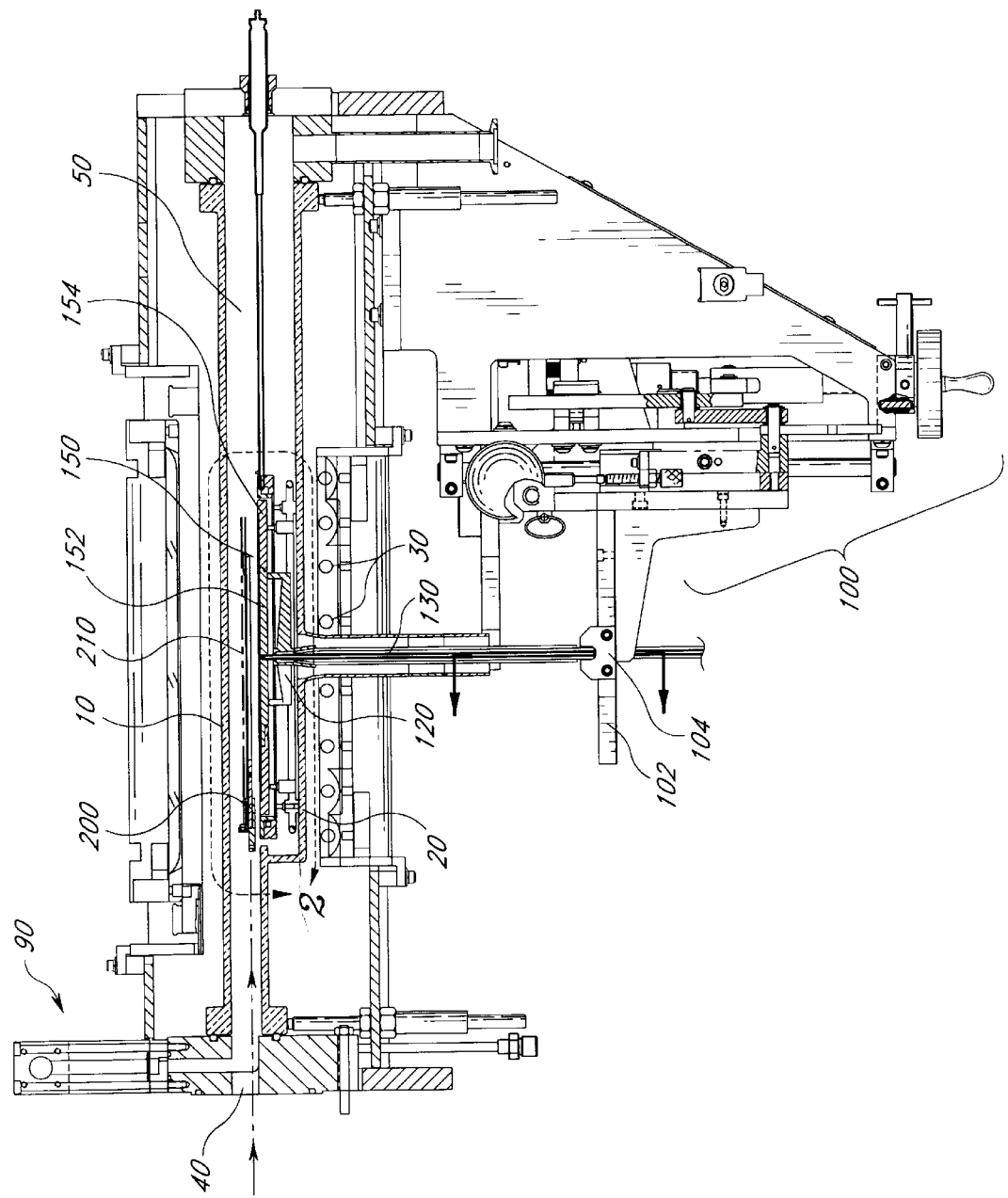
FIG. 1 is a cross-sectional view showing the overall assembled system.

Referring first to FIG. 1, the overall system of the present invention is shown, having a susceptor lift assembly 100 for generating vertical movement in the susceptor unit 150. The susceptor unit comprises an inner 152 and outer 154 section. The vertical movement generated within the susceptor lift assembly 100 is transferred to a mounting plate 102 which communicates with a drive shaft 130 via a coupling assembly 104 attached to the mounting plate and other components not shown. The vertically movable drive shaft also enables rotational movement of the susceptor unit. A support spider 120, coupled to the upper end of the drive shaft 130, is capable of selectively engaging either the inner or outer susceptor sections, 152 and 154, respectively. Thus, the support spider 120 directly provides both vertical support as well as rotational movement for the susceptor unit. A robotic arm end effector 200 is employed for loading and unloading wafers from the reaction chamber 50; a wafer 210 is shown resting on the end effector. The susceptor unit 150 and support spider 120 are described in greater detail below.

The overall system incorporates a number of elements, known in the field of semiconductor reactors, which are also illustrated in FIG. 1. These include upper and lower walls 10 and 20, respectively, of a quartz chamber, thermal energy means 30, and a robotic arm access port 40. Reactant gases are introduced into the reaction chamber 50, via a gas injector system 90. As is known, both horizontal (as shown in FIG. 1) and axial reaction chambers may be employed in various configurations; the horizontal configuration illustrated is intended only as a typical, schematic representation of such chambers.

Figure 2:
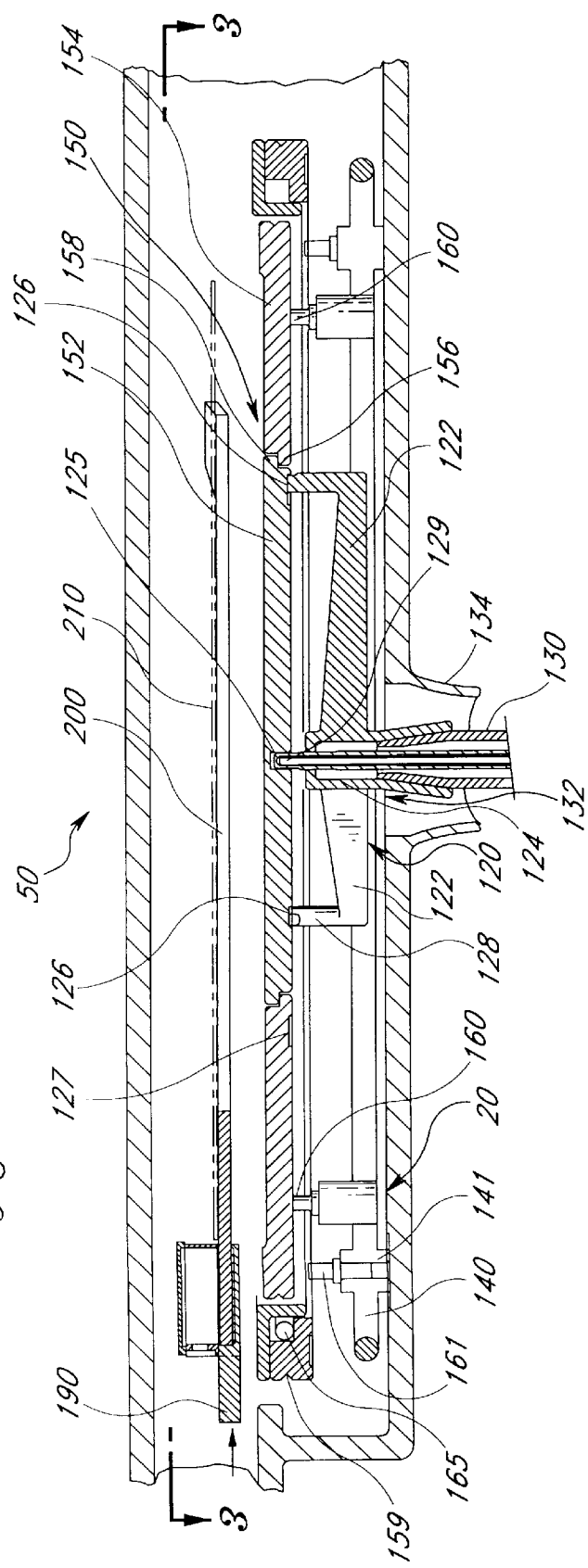
FIG. 2 is an enlarged cross-sectional view of the reaction chamber, described by line 2 of FIG. 1, showing the inner and outer sections which comprise the susceptor unit, the support spider, and a wafer supported by the end effector.

FIG. 2 shows the reaction chamber 50 in greater detail. From this cross-sectional view it can be seen that the susceptor unit 150 comprises two sections, an inner section 152 and an annular outer section 154, which both surrounds and provides vertical support for the inner section. This vertical support consists of offsetting, complementary flanges. The outer section protrudes radially inward along its lower inside margin to provide a supportive flange 156, whereas the inner section protrudes radially outward along its upper circumferential margin to provide a complementary inner section flange 158, which overhangs the outer section flange 156. When the susceptor unit is in its lowest position, as illustrated in FIG. 2, the outer susceptor section rests on a plurality of supports 160.

The drive shaft 130 enters the reaction chamber through an opening 132 in the bottom of the chamber, the walls of the chamber being continuous with a sleeve 134 that surrounds the drive shaft. The upper end of the drive shaft articulates with a support spider 120, located under the susceptor unit within the reactor chamber. The spider has a plurality of support elements, or arms 122, which radiate outward from a central hub 124. The distal ends of the arms 122 terminate in support posts or pegs 128 which fit within recessed seats 126 and 127 in the lower surfaces of the inner or outer susceptor sections, respectively (in this illustration, the spider is shown engaging the inner section 152). The articulation between the spider arms 122 and the recessed seats 126 provide a positive coupling means for effecting the rotational movement of the susceptor, and maintaining concentricity of the spider and susceptor during thermal expansions.

Surrounding the susceptor is a temperature compensation ring 159 supported on pegs 161 extending upwardly from a support ring 140 having legs 141 resting on the bottom wall 20 of the chamber. The ring 140 may be more clearly seen in FIG. 4, and it can be seen that the susceptor supports 160 are attached to the ring. A thermocouple 165 is shown within the ring 159 to sense the temperature of the ring and susceptor in that area.

FIG. 2 also illustrates the robotic arm 190, having an end effector 200 disposed on its distal end and carrying a wafer 260. The robotic arm enters the reaction chamber from an access port (located to the left). The top view of the reaction chamber shown in FIG. 3, illustrates another aspect of the relationship between the wafer 210, robotic arm end effector 200, the inner 152 and outer 154 susceptor sections and the support spider 120. As may be seen, the end effector 200 has a forked end that cradles the wafer on support arms 202, leaving between the arms, an open area which is sufficiently large to accommodate the inner susceptor section 152. Consequently, the inner susceptor section can travel vertically between the open arms 202 of the end effector, thereby picking up an unprocessed wafer and unloading a processed wafer.

The relationship between the inner and outer susceptor sections is also illustrated in FIG. 3. The inner section 152 is shown surrounded by the annular outer section 154. Both the inner and outer sections have a plurality of circumferentially spaced, complementary, offsetting segments or tabs 162 and recesses 164, such that the tabs on the inner section fit snugly within the recesses in the outer section and visa versa. Consequently, the two susceptor sections fit together to form a substantially flat susceptor unit. Moreover, when the two susceptor sections are together, vertically disposed in the same plane, the interlocking tabs and recesses enable positive transfer of rotational torque, allowing the susceptor sections to rotate as a single unit. The outer susceptor supports 160 extend inwardly from the support ring 140. The supports 160 and 161 are shown in solid lines for ease of viewing, although they are hidden from above by the susceptor and the ring 159.

Although the support spider 120 is below the inner section 152, it is illustrated in solid lines in one position, and broken lines in its second position to facilitate understanding. The spider comprises a central hub 124 and a plurality of support elements, or arms 122. As can be appreciated from the illustration, rotation of the spider (in this case by 60 degrees), will cause the arms to selectively engage either the inner susceptor tabs 162 or the outer susceptor tabs 164.

The exploded view in FIG. 4A is useful in illustrating the vertical relationships among the major components of the wafer transfer mechanism. The wafer 210 is supported by the robotic arm end effector 200, along the margin of the wafer by the arms 202 of the end effector. The inner susceptor section 152 tabs 162 may be seen extending radially outward from its outer margin. Between each tab 162 is a recess 166. On the lower surface of the inner section is a centrally disposed recess 125 which is adapted to accommodate the tip of a thermocouple 129 that extends through the shaft 130 and hub 124 of the support spider 120. The lower surface of each tab has a recessed seat 126 for receiving the support peg 128 on the distal end of each spider arm 122.

The annular outer susceptor section 154 tabs 164 may be seen extending radially inward from its inner margin into a central hole 169. Between each tab 164 is a recess 168. The tabs and recesses on the inner susceptor are complementary to those on the outer susceptor, so that an inner section tab 162 fits within an outer section recess 168 and an outer section tab 164 fits within an inner section recess 166, permitting the two susceptor sections to fit together. The inner section is vertically supported within the outer section by the offsetting flanges, 156 and 158. The overhanging flange 158 on the inner section rests on the under-extending flange 156 on the outer section. Note that the flanges extend both radially and circumferentially such that there is no light path through the susceptor. Also, the combined thickness of the flanges is equal to the thickness of the susceptor sections, thus, giving the entire susceptor the constant thickness in the area in which a wafer is placed.

Figure 4C:
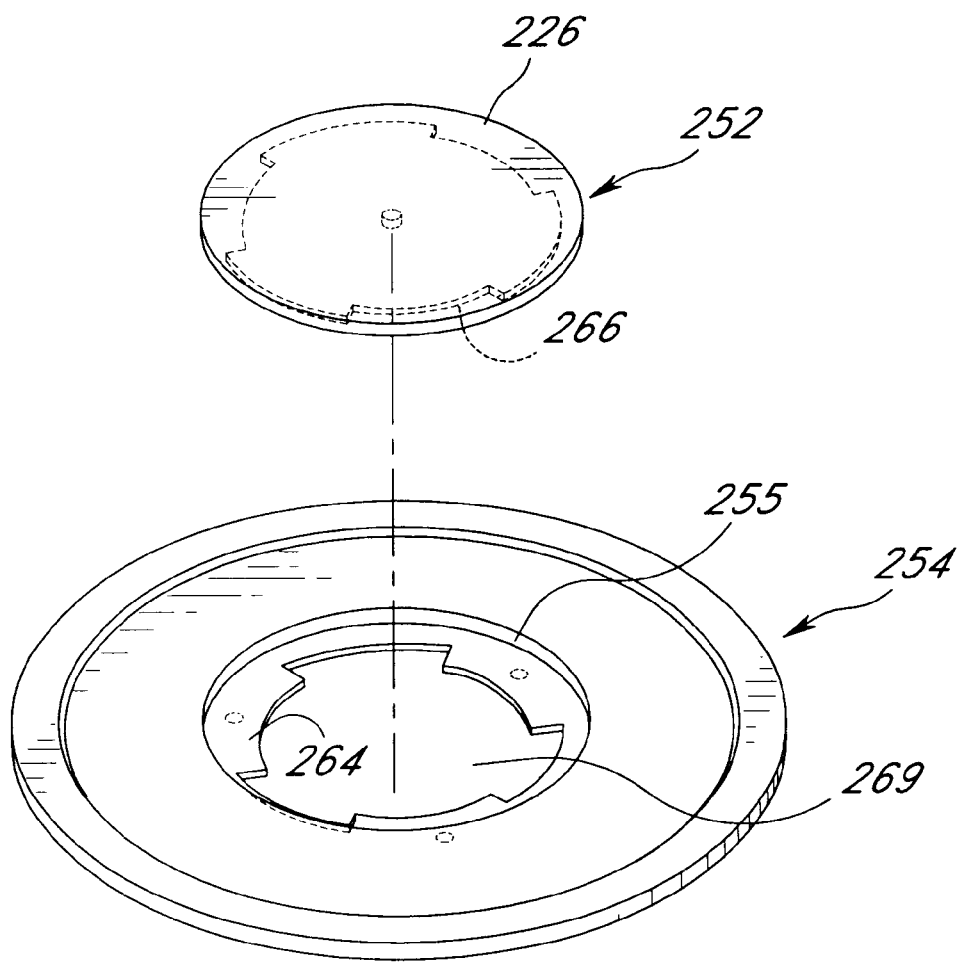
FIG. 4C is an exploded perspective view of an alternate configuration of the interface between the two susceptor sections.

The interface between the inner and outer sections, as seen from above, is in the shape of the periphery of the inner section 152, that is, extending circumferentially and radially. An arrangement to shorten the length of the interface is illustrated in FIG. 4C wherein an inner section 252 is shown as having a circular upper portion which fits within a corresponding circular recess 255 in an outer section 254. The diameter of the inner section 252 is the same as that for the section 152 in FIG. 4A, but the recesses 166 of section 152 are not formed in the upper portion of the alternative inner section 252. Recesses 266 are, however, formed in the lower portion of the inner section 252. Thus, the upper portions of section 252 that are above the recesses 266 are, in effect, flanges that fit within corresponding recess within the lower portion of the section 254. That is, as can be seen from FIG. 4C, the upper portion of the outer section 254 surrounding the central opening 269 is completely circular, while the lower portion of the outer section 254 is the same as in the lower portion of the outer section 154. Thus, section 254 includes three inwardly extending tabs or segments 264 that fit within the corresponding recesses 266 of the inner section 252. Similarly, segments 226 of the inner portion fit within the recesses 268 of the outer section. As noted above, the advantage of this arrangement is that the wafer faces a circular line between the two susceptors sections rather than the longer radially in and out line of the arrangement of FIG. 4A.

The support spider 120 may be more clearly seen positioned on the end of the drive shaft 130. The thermocouple 129 extends through the center of the hub 124. The plurality of support elements, or arms 122, extend radially outward from the hub, each arm terminating in a support peg 128. The support pegs are adapted to fit within the recessed seats 126 and 127, in the inner and outer susceptor sections, respectively.

Operation

The operation of the system can be more clearly understood in reference to FIGS. 5–8. First, to load an unprocessed wafer into the reaction chamber, the robotic arm 190 enters the chamber via an access port with the end effector 200 supporting the unprocessed wafer or substrate 210. The end effector and wafer are positioned directly above the susceptor unit 150. Then the inner susceptor section 152 is raised by the support spider 120. The inner susceptor section passes vertically between the open arms of the end effector, lifting the wafer 210 from the end effector as seen in FIG. 5. This highest position of the inner susceptor section 152 may be referred to as a "load/unload-etch" position. In this position, the robotic arm is withdrawn from the reaction chamber. The inner section 152 and the wafer are then lowered until the inner section comes to rest within the outer section 154; offsetting flanges on the inner and outer sections, respectively, cooperate to support the inner section within the outer section. The susceptor unit formed when the two susceptor sections come together is supported by the outer susceptor supports 160, attached to the support ring 140. As seen in FIG. 6, the susceptor unit is slightly below the wafer processing position.

Next, to process the wafer, the support spider must rotate to engage the outer susceptor section so it can raise the entire susceptor unit 150 together with the wafer into an elevated processing position. Specifically, once the spider 120 has traveled down to its lowest, "disengage/rotate" position, the support pegs 128 on the ends of the spider arms completely disengage from the recessed seats in the lower surface of the inner susceptor section. Then the spider 120 is free to rotate to a second position wherein the support pegs 128 are now situated directly below recessed seats in the lower surface of the outer susceptor section. As the spider is raised, it engages the outer section as shown in FIG. 6 and causes the susceptor unit 150 to rise. When the wafer is in an optimal, "processing" position for chemical vapor deposition, such that the upper surface of the wafer is in approximately the same plane as the upper surface of the temperature compensation ring 159, as shown in FIG. 7, the support spider stops traveling upward. During processing, the support spider causes the susceptor unit and wafer to rotate, thus facilitating more uniform deposition.

To unload the processed wafer 210 from the reaction chamber, the spider 120 is lowered. The susceptor unit and wafer travel downward until the outer susceptor section 154 comes to rest on the outer susceptor supports 160. Once again, the spider 120 continues lowering to the "disengage/rotate" position disengages from the susceptor unit. The spider then rotates back to its first position, in which the support pegs on the spider arms are again aligned directly below the recessed seats on the inner susceptor section 152. Now, the spider rises, lifting the inner susceptor, together with the wafer, out of the outer susceptor section, which remains resting on the outer susceptor supports. The inner section and wafer are raised to the highest, load/unload-etch position, which is high enough to permit the robotic arm end effector to enter the reaction chamber between the elevated inner susceptor section and the lower outer susceptor section; the arms of the end effector straddle the spider. Consequently, when the spider lowers, the inner susceptor section travels down between the forked arms of the end effector. As the inner section continues downward, the wafer, which substantially overhangs the inner section, comes to rest on the forked arms of the end effector. The robotic arm is then withdrawn, together with the processed wafer.

Finally, cleaning of the susceptor unit by chemical etching, can be accomplished between processing cycles at the highest, load/unload-etch vertical stop illustrated in FIG. 8. Gases known in the art, such as hydrogen chloride, may be used for etching. The raised position facilitates cleaning of both the upper and lower surfaces of the susceptor unit.

Figure 9:
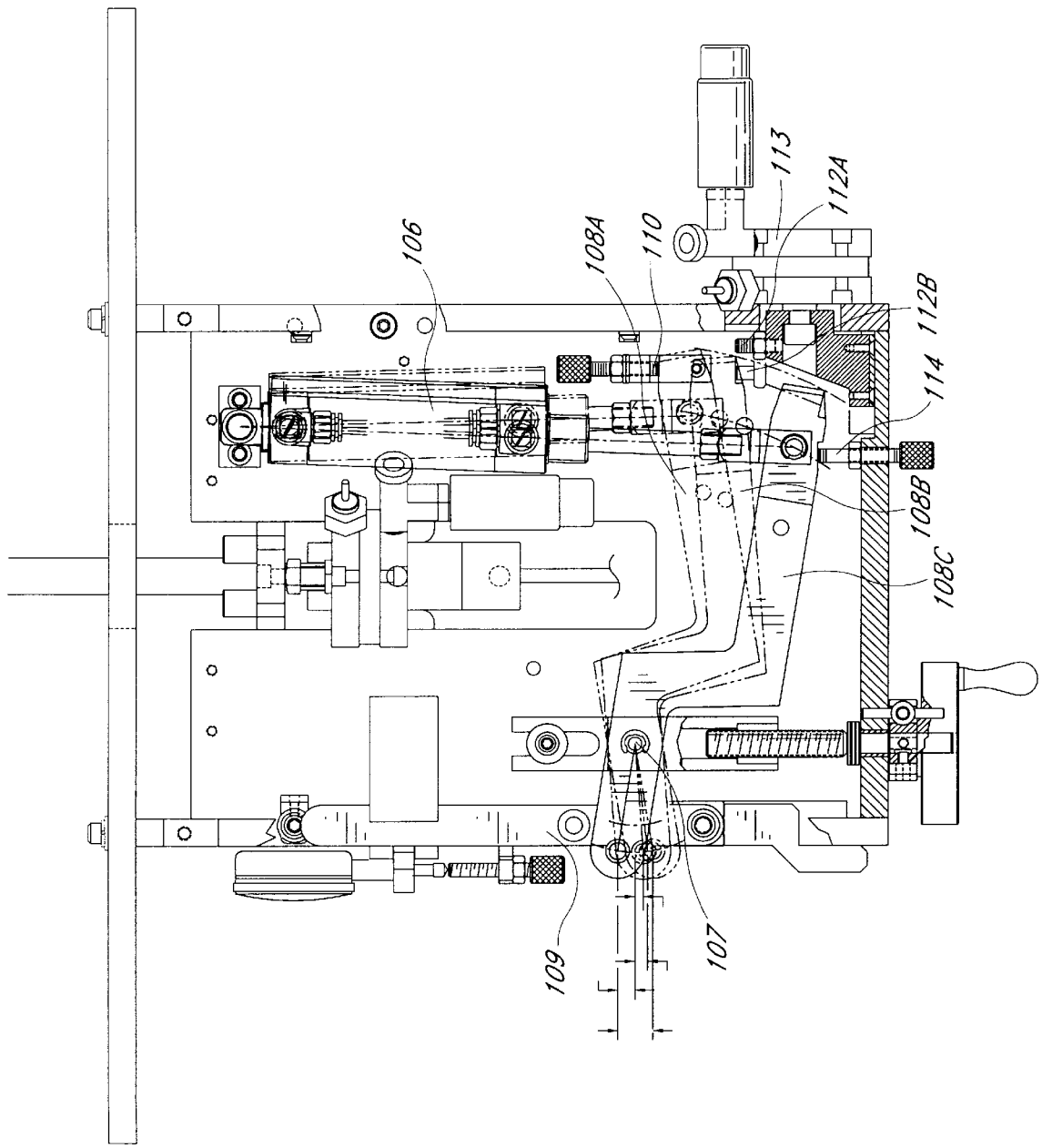
FIG. 9 is a cross-sectional view from the side of the lift assembly, showing the lever and vertical stops.

Various mechanisms may be employed for raising and lowering the susceptor. The lift assembly 100 illustrated in FIGS. 1 and 9 includes a lever 108 pivotally mounted on a pin 107. An actuator 106 attached to one end of the lever is operable for pivoting the lever 108, which in turn moves up and down a member 109, up and down which is connected to the mounting plate 102. There are three adjustable stops for regulating the vertical movement of the lever. These correspond to the three vertical positions of the support spider (lower 108a, disengage/rotate; middle 108b, processing; and upper 108c, load/unload-etch). The lower position can be adjusted by adjusting the lower position stop 110. The middle, processing position stop 112 (shown in two positions) can be engaged or disengaged by operation of a pneumatic actuator 113. When the stop is withdrawn to the solid line position shown by 112a, the lever does not stop at this middle position, but travels freely between the upper and lower stops. In contrast, when the stop 112 moves to the phantom position shown by 112b, the lever is stopped in the middle position 108b. The upper, load/unload-etch position 108c is regulable by adjustment of stop 114. In addition to the elevator mechanism 100 for vertically moving the drive shaft, there is also provided any suitable drive for rotating the shaft 130.

Although the invention has been described in detail for the purpose of illustration, variations can be made by those skilled in the art without departing from the spirit and scope of the invention which is defined by the following claims. For example, when a portion of the susceptor is raised to load or unload a wafer, the vertical movement to transfer the wafer between the end effector and the susceptor can be provided by moving the end effector vertically, rather than the susceptor section. That is, when a susceptor section has been elevated to receive a wafer, the end effector could be lowered to transfer the wafer to the susceptor section. Similarly, when a wafer is to be unloaded from the susceptor, and the end effector is inserted beneath the wafer, the end effector could be raised to lift the wafer from the susceptor section.

Likewise, the relative vertical movement required between the two susceptor sections to enable the spider to rotate could be provided by moving the outer supports 160 vertically rather than the spider. That is, once the susceptor is lowered to the disengage/rotate position comparable to that of FIG. 6, the supports 160 could be elevated slightly to separate the outer susceptor section from the inner section and allow the spider rotate to the position where it can be moved to engage in the inner section. Alternatively, a separate actuator could engage the outer section directly rather than through the supports 160.

In yet another arrangement shown schematically in FIG. 4B, the spider 120 can remain in contact with the outer section at all times, and a separate actuator spider 220, concentric and rotatable with the spider 120, can move vertically relative to the spider 120 to raise and lower the inner section to load and unload the wafer. With that arrangement, the supports 160 are not needed, and the need to index the spider 60° and to have the disengage/rotate position could be eliminated.

It should also be noted that various arrangements may be utilized to form the separable connection between the inner and outer susceptor sections. That is, configurations other than the lobed or segmented ones illustrated in FIGS. 4A and 4B may be utilized and fall within the scope of the invention.

What is claimed is:

1. An apparatus comprising:
    a susceptor having first and second sections which together form a susceptor unit for supporting a substrate; and
    a first susceptor support having one position in which it supports said first section, and a second position rotated with respect to said sections in which it supports the second section.

2. The apparatus of claim 1, wherein said sections are rotatably coupled and are vertically moveable relative to each other to facilitate loading and unloading of the substrate.

3. The apparatus of claim 1, wherein said first susceptor section has a generally annular shape which surrounds said second section, and said sections have interengaging portions that cause them to be rotationally coupled.

4. The apparatus of claim 3, wherein said sections are vertically coupled so that said first section supports said second section, but said sections are vertically movable relative to each other.

5. The apparatus of claim 1, wherein said first section is configured to vertically support said second section and said sections have a substrate process position in which said support engages said first section in which said support and said sections are rotatably coupled so that rotation of said support will rotate the susceptor unit.

6. The apparatus of claim 5, wherein said susceptor sections have a load/unload position in which said support engages the second section, and said sections are relatively movable vertically so as to enable said second section to cooperate with a tool carrying a substrate for transfer of the substrate to and from the second section.

7. The apparatus of claim 1, including a second susceptor support for supporting said first susceptor section when the first mentioned support is supporting the second section.

8. The apparatus of claim 7, wherein said supports are vertically movable relative to each other.

9. The apparatus of claim 1, wherein said susceptor unit has a process position wherein the support engages the first susceptor section which in turn supports the second section; and wherein, said support is vertically movable to move said susceptor unit from said process position to an etch position spaced above the process position.

10. The apparatus of claim 1, wherein said sections include interengaging portions that enable said first section to vertically support said second section, and said interengaging portions rotatably couple said sections.

11. The apparatus of claim 10, wherein said sections are vertically movable relative to each other.

12. The apparatus of claim 1, including a tool having a forked end portion for supporting a substrate, and said second susceptor section is sized to fit between said forked end during relative vertical movement between the fork and the second susceptor section.

13. The apparatus of claim 1, wherein said first section has a generally annular shape and a plurality of circumferentially spaced segments which radiate inwardly from the inner margin of its annular shape, and said second section has a plurality of circumferentially space segments which radiate outwardly to fit between the segments of the first section.

14. The apparatus of claim 13, wherein said segments have interengaging flanged surfaces that enable said first section to vertically support said second section.

15. The apparatus of claim 1, wherein said first section has a generally annular shape with a concentrically positioned circular recess, and said second section has a circular outer and upper portion which fits within said recess.

16. The apparatus of claim 15, wherein said first section has flange portions positioned beneath said recess, and said second section has peripheral flange portions that extend over the flange portions on said first section, so that said first section supports the second section.

17. The apparatus of claim 16, wherein said sections are rotatably coupled.

18. An apparatus comprising:
    a susceptor having first and second sections which together form a susceptor unit for supporting a substrate; and
    a first susceptor support having one position in which it supports said first section, and a second position rotated with respect to the first position in which it supports the second section, wherein said support is in the form of a multiarm spider which engages a plurality of segments on said first section in said one position, and engages a plurality of segments on said second section in said second position.

19. An apparatus for supporting a substrate comprising:
    an outer annular susceptor section and an inner centrally located susceptor section positioned within the outer section, said sections having interengaging portions that enable the sections to fit together to form a susceptor unit and having substantially coplanar upper surfaces forming a unitary surface for receiving a substrates, said interengaging portions rotatably coupling said sections while permitting relative vertical movement between said sections, said sections having a circular interface on their upper surfaces and having interengaging flange portions on said sections beneath the interface.

20. An apparatus comprising:
    a substrate processing chamber;
    a susceptor in said chamber for horizontally supporting a substrate within the chamber, said susceptor being formed of a central section and a surrounding annular section which supports the inner section, said sections being configured to mate together to form a susceptor unit having an upper surface for receiving a substrate; and one or more supports for said susceptor sections for supporting the susceptor in a process position and for producing relative vertical movement between the sections so that said central section is in a substrate load and unload position to have a substrate transferred to and from a tool and the central susceptor section, said supports including a multi-armed support for supporting and rotating said annular section and a second support for raising said central section to facilitate transfer of a substrate from the tool to the central section.

21. The apparatus of claim 20, wherein said second support is a multiarmed support concentric with the first support but rotatably offset with respect to the first support.

22. An apparatus comprising:

a susceptor having first and second sections which together form a susceptor unit for supporting a substrate; and a first susceptor support having one position in which it supports said first section, and a second position rotated with respect to the first position in which it supports the second section.

23. A method of loading and unloading a substrate from a susceptor in a chamber comprising the steps of:

supporting an outer susceptor section with an outer support while supporting a central susceptor section with said outer section;

producing relative vertical movement between said central susceptor section and said outer susceptor section so that the inner section is spaced above the outer section on a moveable support;

moving a substrate with a tool into position spaced above said central susceptor section;

providing relative vertical movement between said central section and said tool to transfer the substrate to the central section with portions of the substrate overlapping the central section;

withdrawing the robotic arm from above the susceptor;

producing relative vertical movement between said susceptor sections so as to cause the central section to fit within and be supported by the outer susceptor section forming a susceptor unit for supporting said substrate.

24. The method of claim 23, further comprising lowering said movable support further until it is disengaged from said central susceptor section;

rotating the movable support to a position wherein it is beneath said outer susceptor section; and raising said movable support to engage said outer susceptor section and lift the susceptor unit from said outer support and into a process position.

25. The method of claim 24, lowering said susceptor unit so that it rests solely upon the outer support;

lowering said movable support further and rotating it so that it is beneath said inner susceptor section;

raising said inner susceptor section to lift said substrate above said susceptor section;

moving said robotic arm end effector horizontally in a plane between the susceptor sections;

producing relative vertical movement between the inner susceptor section and the tool to transfer the substrate to the tool; and withdrawing the end effector horizontally to remove the substrate from above the susceptor.

* * * * *